United States Patent
Kato et al.

(10) Patent No.: US 9,650,538 B2
(45) Date of Patent: *May 16, 2017

(54) METHOD FOR MANUFACTURING MICRO-STRUCTURE

(71) Applicant: SHIN-ETSU CHEMICAL CO., LTD., Tokyo (JP)

(72) Inventors: Hideto Kato, Annaka (JP); Hiroshi Kanbara, Annaka (JP); Tomoyoshi Furihata, Annaka (JP); Yoshinori Hirano, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/305,767

(22) Filed: Jun. 16, 2014

(65) Prior Publication Data

US 2014/0296380 A1    Oct. 2, 2014

Related U.S. Application Data

(62) Division of application No. 13/157,460, filed on Jun. 10, 2011, now Pat. No. 8,785,114.

(30) Foreign Application Priority Data

Jun. 11, 2010   (JP) .................................. 2010-133606

(51) Int. Cl.
| | | |
|---|---|---|
| *G03F 7/023* | (2006.01) | |
| *C09D 163/04* | (2006.01) | |
| *G03F 7/022* | (2006.01) | |
| *B81C 1/00* | (2006.01) | |
| *G03F 7/40* | (2006.01) | |
| *G03F 7/30* | (2006.01) | |
| *G03F 7/20* | (2006.01) | |

(52) U.S. Cl.
CPC ........ *C09D 163/04* (2013.01); *B81C 1/00619* (2013.01); *G03F 7/0226* (2013.01); *G03F 7/0236* (2013.01); *G03F 7/30* (2013.01); *G03F 7/40* (2013.01); *G03F 7/70466* (2013.01); *B81C 2201/0108* (2013.01)

(58) Field of Classification Search
CPC .............................. G03F 7/023; G03F 7/0236
USPC .......................... 430/165, 190, 191, 192, 193
See application file for complete search history.

(56) References Cited

U.S. PATENT DOCUMENTS

| | | | |
|---|---|---|---|
| 4,931,381 A | | 6/1990 | Spak et al. |
| 5,723,254 A | * | 3/1998 | Zampini ................... C08G 8/28 430/190 |
| 5,985,507 A | * | 11/1999 | Blakeney ................. C08G 8/16 430/190 |
| 6,790,582 B1 | | 9/2004 | Eilbeck |
| 6,958,123 B2 | | 10/2005 | Reid et al. |
| 7,175,960 B2 | | 2/2007 | Furihata et al. |
| 7,638,253 B2 | * | 12/2009 | Park et al. ...................... 430/170 |
| 8,785,114 B2 | * | 7/2014 | Kato et al. ...................... 430/325 |
| 8,835,091 B2 | * | 9/2014 | Hirano et al. .................. 430/190 |
| 8,871,422 B2 | * | 10/2014 | Minegishi ................... 430/270.1 |
| 2003/0047533 A1 | | 3/2003 | Reid et al. |
| 2008/0211076 A1 | | 9/2008 | Nishiuchi et al. |

FOREIGN PATENT DOCUMENTS

| | | |
|---|---|---|
| EP | 1 471 540 A1 | 10/2004 |
| JP | 5-27446 A | 2/1993 |
| JP | 11-37875 A | 2/1999 |
| JP | 2000-255072 A | 9/2000 |
| JP | 2004-177683 A | 6/2004 |
| JP | 2005-91497 A | 4/2005 |
| JP | 2008-213061 A | 9/2008 |
| JP | 2009-226845 A | 10/2009 |
| JP | 2009-244663 A | 10/2009 |
| JP | 2009-271101 A | 11/2009 |

OTHER PUBLICATIONS

Extended European Search Report issued Jul. 4, 2012, in European Patent Application No. 11169115.0.
Japanese Office Action dated Mar. 18, 2014, issued in corresponding Japanese Patent Application No. 2011-113622.

* cited by examiner

*Primary Examiner* — John S Chu
(74) *Attorney, Agent, or Firm* — Birch, Stewart, Kolasch & Birch, LLP

(57) ABSTRACT

A micro-structure is manufactured by patterning a sacrificial film, forming an inorganic material film on the pattern, providing the inorganic material film with an aperture, and etching away the sacrificial film pattern through the aperture to define a space having the contour of the pattern. The patterning stage includes the steps of (A) forming a sacrificial film using a composition comprising a cresol novolac resin and a crosslinker, (B) exposing patternwise the film to first high-energy radiation, (C) developing, and (D) exposing the sacrificial film pattern to second high-energy radiation and heat treating for thereby forming crosslinks within the cresol novolac resin.

12 Claims, 1 Drawing Sheet

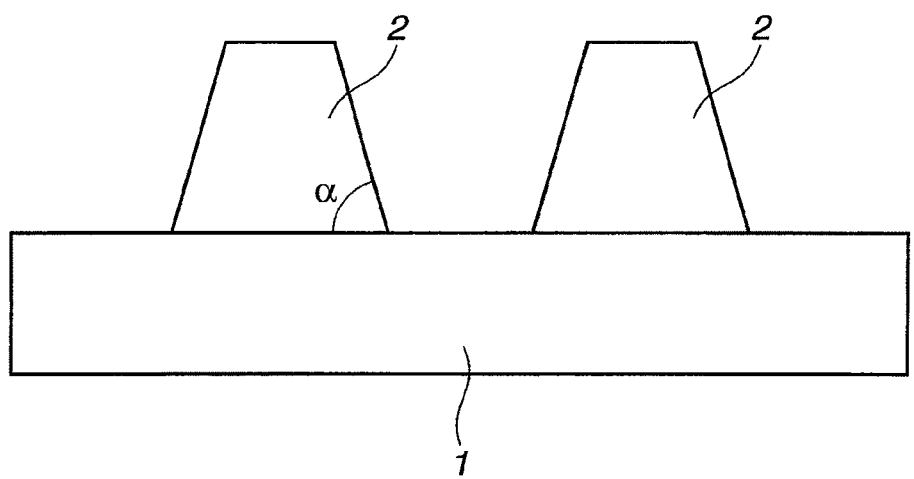

METHOD FOR MANUFACTURING MICRO-STRUCTURE

CROSS-REFERENCE TO RELATED APPLICATIONS

This application is a Divisional of co-pending application Ser. No. 13/157,460 filed on Jun. 10, 2011, which claims priority under 35 U.S.C. §119(a) on Japanese Patent Application No. JP 2010-133606 filed in Japan on Jun. 11, 2010, the entire contents of which are hereby incorporated by reference.

TECHNICAL FIELD

This invention relates to a method for manufacturing a micro-structure, especially micro-electromechanical system (MEMS) element. More particularly, it relates to a method for manufacturing a micro-structure by a sacrificial layer etching technique including forming a sacrificial film pattern (or resin structure) on a substrate, depositing an inorganic material film on the sacrificial film pattern, optionally processing the inorganic material film into a predetermined shape, and etching away the sacrificial film pattern (or resin structure) to form a structure having a desired space. It also relates to a sacrificial film-forming composition.

BACKGROUND ART

With the advance of the micro-component technology, attention is paid to not only semiconductor devices, but also MEMS devices and micro-equipment having MEMS devices built therein. MEMS devices are constructed as micro-structures on substrates including silicon substrates and glass substrates. In these devices, a driver component for delivering a mechanical drive force, a driving mechanism for driving the driver component, and a semiconductor integrated circuit for controlling the driving mechanism are electrically and mechanically combined.

The characteristic feature of the MEMS device is that the driver component constructed as a mechanical structure is incorporated as part of the device. Driving of the driver component is electrically performed by adapting a Coulomb attraction between electrodes. For example, an optical MEMS device functioning as an optical modulator utilizing the movement of a driver component in the reflection or diffraction of light has been developed as a typical MEMS device.

The MEMS device is manufactured by the micromachining technology, which is generally classified into two categories. One technology is bulk micromachining based on silicon bulk etching. This is the technology of processing a silicon substrate itself to form a three-dimensional structure and becomes the mainstream of the current micromachining technology.

The other technology is surface micromachining. The method involves depositing a sacrificial layer and a thin film on a surface of a silicon substrate from different materials in sequence, patterning the thin film on the outermost surface side into a desired shape, and selectively etching away the sacrificial layer, leaving a structure having a cavity. As examples of implementing the technology, Patent Document 1 discloses a method for manufacturing a pressure sensor; Patent Document 2 discloses a method for manufacturing an inkjet printer head; and Patent Document 3 discloses a method for manufacturing a MEMS device having a hollow layer.

CITATION LIST

Patent Document 1: JP-A H11-037875
Patent Document 2: JP-A 2000-255072
Patent Document 3: JP-A 2008-213061 (US 20080211076)
Patent Document 4: JP-A 2009-271101
Patent Document 5: JP-A 2005-091497
Patent Document 6: JP-A H05-027446

DISCLOSURE OF INVENTION

In the prior art surface micromachining technology, the sacrificial layer is formed of various materials including silicon oxide in Patent Document 1, positive novolac resist in Patent Document 2, and polyimide in Patent Document 3. The use of polyimide is accompanied by a lowering of micro-processing ability. Inorganic materials such as silicon oxide are difficult to ensure that the cavity defined after etching is of sufficient space. The positive novolac resist is advantageous for the formation of micro-structure, but less heat resistant, giving rise to the problem that the selection of inorganic material film of which the structure is made is substantially limited. This leads to a lowering of production yield. On the other hand, Patent Document 4 discloses a sacrificial layer etching method using a negative photosensitive composition as the material which is advantageous for the formation of micro-structure and relatively highly heat resistant. Since the negative photosensitive composition essentially has the nature that its pattern profile becomes inversely tapered. When silicon or metal is formed on the resin, it is difficult to completely deposit silicon or metal underneath the inversely tapered portion. It is then difficult to form a precise structure and hence, to provide a precise space configuration.

In connection with the sacrificial layer etching technique which is a predominant stage of the MEMS device fabrication, an object of the invention is to provide a method for manufacturing a micro-structure and a sacrificial film-forming composition, which can form a sacrificial film pattern having a pattern profile and heat resistance sufficient to accept the deposition of silicon or metal material at high temperature and hence, can form a high-precision micro-structure.

To improve the percent yield of products in the surface micromachining process, it is a key in the sacrificial layer etching technique that the pattern formed from a sacrificial film has high precision, appropriate profile, and heat resistance. Regarding an optically patternable sacrificial film-forming composition, the inventors attempted to use a material providing a high resolution, to select such a material that the profile of a sacrificial film pattern may not be inversely tapered, and to impart heat resistance to the material. The inventors have found that a sacrificial film pattern having the desired performance is obtainable using a material and process as defined below.

In one aspect, the invention provides a method for manufacturing a micro-structure comprising the stages of (i) processing a sacrificial film on a substrate to form a sacrificial film pattern, (ii) forming an inorganic material film on the sacrificial film pattern, (iii) providing a portion of the inorganic material film with an aperture for etching, and (iv) etching away the sacrificial film pattern through the aperture to define a space having the contour of the sacrificial film pattern. The stage (i) of forming a sacrificial film pattern includes the steps of:

(A) forming an optically patternable sacrificial film of 2 to 20 μm thick using a sacrificial film-forming composition comprising (A-1) (i) a cresol novolac resin having some or all phenolic hydroxyl groups esterified with 1,2-naphthoquinonediazidosulfonyl halide, or (ii) a mixture of a cresol novolac resin having some or all phenolic hydroxyl groups esterified with 1,2-naphthoquinonediazidosulfonyl halide and a cresol novolac resin having phenolic hydroxyl groups non-esterified, (A-2) the novolac resin (i) or the novolac resin mixture (ii) of (A-1) and a 1,2-naphthoquinonediazidosulfonic acid ester, or (A-3) a cresol novolac resin having phenolic hydroxyl groups non-esterified and a 1,2-naphthoquinonediazidosulfonic acid ester, and a crosslinker capable of forming crosslinks within the cresol novolac resin in the presence of an acid catalyst, (B) exposing patternwise the optically patternable sacrificial film to first high-energy radiation, (C) developing the sacrificial film with an alkaline developer to form a positive sacrificial film pattern, and (D) exposing the sacrificial film pattern to second high-energy radiation, and then heating the sacrificial film pattern at a temperature of 100 to 220° C., for thereby forming crosslinks within the cresol novolac resin in the sacrificial film pattern.

In a preferred embodiment, the crosslinker is a melamine compound and said sacrificial film-forming composition comprises 2 to 30% by weight of the melamine compound in the total solids weight of the composition. In a more preferred embodiment, the melamine compound comprises at least 80% by weight of a hexamethoxymethylol melamine monomer.

In a preferred embodiment, the cresol novolac resin used in the sacrificial film-forming composition or a cresol novolac resin from which the cresol novolac resin having phenolic hydroxyl groups esterified is derived is a cresol novolac resin containing at least 40 mol % of p-cresol and having a weight average molecular weight of 2,000 to 30,000 and a melting temperature of at least 130° C.

In a preferred embodiment, the content of component (A-1), (A-2) or (A-3) is 45 to 98% by weight in the total solids weight of the sacrificial film-forming composition, and the total amount of the esterized cresol novolac resin and the non-esterized cresol novolac resin is at least 67% by weight in component (A-1), (A-2) or (A-3).

In a preferred embodiment, the second high-energy radiation is ultraviolet radiation with a wavelength of at least 350 nm.

In a preferred embodiment, the sacrificial film-forming composition is such that the sacrificial film pattern resulting from the pattern forming step has a side wall which is forward tapered at an angle from 80° to less than 90° relative to the substrate.

In another aspect, the invention provides an optically patternable sacrificial film-forming composition for use in surface micro-machining process, comprising (A-1) (i) a cresol novolac resin containing at least 40 mol % of p-cresol and having a weight average molecular weight of 2,000 to 30,000 and a melting temperature of at least 130° C. in which some or all phenolic hydroxyl groups are esterified with 1,2-naphthoquinonediazidosulfonyl halide, or (ii) a mixture of the cresol novolac resin having some or all phenolic hydroxyl groups esterified with 1,2-naphthoquinonediazidosulfonyl halide and a cresol novolac resin containing at least 40 mol % of p-cresol and having a weight average molecular weight of 2,000 to 30,000 and a melting temperature of at least 130° C. in which phenolic hydroxyl groups are not esterified, (A-2) the novolac resin (i) or the novolac resin mixture of (A-1) and a 1,2-naphthoquinonediazidosulfonic acid ester, or (A-3) a cresol novolac resin containing at least 40 mol % of p-cresol and having a weight average molecular weight of 2,000 to 30,000 and a melting temperature of at least 130° C. in which phenolic hydroxyl groups are not esterified and a 1,2-naphthoquinonediazidosulfonic acid ester, and a crosslinker capable of forming crosslinks within the cresol novolac resin in the presence of an acid catalyst.

In a preferred embodiment, the content of component (A-1), (A-2) or (A-3) is 45 to 98% by weight in the total solids weight of the sacrificial film-forming composition, and the total amount of the esterized cresol novolac resin and the non-esterized cresol novolac resin is at least 67% by weight in component (A-1), (A-2) or (A-3).

In a preferred embodiment, the crosslinker is a melamine compound and said sacrificial film-forming composition comprises 2 to 30% by weight of the melamine compound in the total solids weight of the composition.

In a preferred embodiment, a cresol novolac resin in which 1 to 30 mol % of phenolic hydroxyl groups are esterified with 1,2-naphthoquinonediazidosulfonyl halide is present.

In the specification, the term "micro-structure" refers to structures in which various three-dimensional components are formed on a surface of silicon, glass or similar substrates. Exemplary micro-structures include parts to constitute various devices, such as pressure sensors and digital micromirror devices (DMD), as mounted on automobiles, as well as surface acoustic wave (SAW) filters and printer heads for inkjet printers.

Advantageous Effects of Invention

The method for manufacturing a micro-structure according to the invention is effective for forming a sacrificial film pattern having a high-precision planar shape, an appropriate sidewall shape, and improved heat resistance.

BRIEF DESCRIPTION OF DRAWINGS

The FIGURE is a cross-sectional view of a positive resist pattern.

DESCRIPTION OF EMBODIMENTS

The invention pertains to a method for manufacturing a micro-structure which may be advantageously used in the fabrication of MEMS components by surface micromachining. When a cavity or space is formed by surface micromachining, the desired micro-structure is manufactured by the steps of:

(i) processing a sacrificial film on a substrate to form a sacrificial film pattern, (ii) forming an inorganic material film on the sacrificial film pattern, (iii) providing a portion of the inorganic material film with an aperture for etching, and (iv) etching away the sacrificial film pattern through the aperture to form a space having the contour of the sacrificial film pattern.

According to the surface micromachining process, an inorganic material film is formed in stage (ii) on the sacrificial film pattern resulting from stage (i) as described above, yielding a wall structure for defining the cavity or space to be formed in the micro-structure. If the sacrificial film pattern has an inversely tapered wall at this point of time, it is difficult to deposit the inorganic material without leaving gaps. It is then impossible to accurately control the cavity or space-surrounding wall structure. For this reason, the sacrificial film pattern should have a forward tapered wall when stage (ii) is carried out.

A sacrificial film pattern may be formed using a positive resist composition based on a novolac resin and naphthoquinonediazido as used in Patent Document 2. This is advantageous in that the desired shape can be readily formed because the composition is positive and is easily controlled such that the dissolution rate at the bottom of the sacrificial film may be lower than that at the top. The positive resist film, however, is generally susceptible to shape changes upon heating. It cannot be selected as the sacrificial film material when stage (ii) is performed at a temperature of 150° C. or higher, and sometimes higher than 200° C.

The inventors have found that when stage (i) uses a specific positive photosensitive material to form a sacrificial film and patterns it by an appropriate process to be described later, a sacrificial film pattern that permits high temperature conditions to be applied in stage (ii) is obtainable. It is desirable that the sidewall of the sacrificial film pattern is as perpendicular as possible when a finer, more accurate microstructure is to be manufactured. In forming a pattern using a photosensitive material film, even in the case of a photosensitive material film having a relatively great thickness of 2 to 20 μm, a choice of a specific material for the film is successful in foaming a sacrificial film pattern 2 on a substrate 1 such that the sidewall of pattern 2 may have a limited angle a of from 80° to less than 90° as shown in the FIGURE. Subsequent specific processing of the sacrificial film pattern imparts heat resistance at a temperature of at least 200° C. while maintaining the sidewall angle in the range of from 80° to less than 90°.

Now stage (i) of forming a sacrificial film pattern is described in detail. Stage (i) includes the steps of:

(A) forming an optically patternable sacrificial film of 2.0 to 20 μm thick using a sacrificial film-forming composition comprising (A-1) (i) a cresol novolac resin having some or all phenolic hydroxyl groups esterified with 1,2-naphthoquinonediazidosulfonyl halide, or (ii) a mixture of a cresol novolac resin having some or all phenolic hydroxyl groups esterified with 1,2-naphthoquinonediazidosulfonyl halide and a cresol novolac resin having phenolic hydroxyl groups non-esterified, (A-2) the novolac resin (i) or the novolac resin mixture of (A-1) and a 1,2-naphthoquinonediazidosulfonic acid ester, or (A-3) a cresol novolac resin having phenolic hydroxyl groups non-esterified and a 1,2-naphthoquinonediazidosulfonic acid ester, and a crosslinker capable of forming crosslinks within the cresol novolac resin in the presence of an acid catalyst, (B) exposing patternwise the optically patternable sacrificial film to first high-energy radiation, (C) developing the sacrificial film with an alkaline developer to form a positive sacrificial film pattern, and (D) exposing the sacrificial film pattern to second high-energy radiation, and then heating the sacrificial film pattern at a temperature of 100 to 220° C., for thereby forming crosslinks within the cresol novolac resin in the sacrificial film pattern.

For the optically patternable sacrificial film-forming composition used in step (A) and comprising a naphthoquinonediazidosulfonic acid ester, a cresol novolac resin, and a crosslinker capable of forming crosslinks between molecules of the cresol novolac resin in the presence of an acid catalyst, any of positive novolac resist compositions, well known for use in the i- or g-line lithography, comprising a naphthoquinonediazidosulfonic acid ester as an optically active structure may be used as the base. Adding the crosslinker to the novolac resist composition yields the sacrificial film-forming composition. In subsequent stage (ii) where an inorganic material film is deposited on the sacrificial film, it is impossible to form an accurately controlled space if the sacrificial film pattern has an inversely tapered sidewall. The use of a positive photosensitive material prevents the sacrificial film pattern from becoming inversely tapered.

The positive novolac resist compositions which are used as the base for the optically patternable sacrificial film-forming composition are known from many patent documents including Patent Documents 5 and 6. The main components are a cresol novolac resin known as binder resin and a naphthoquinonediazidosulfonic acid ester. The naphthoquinonediazidosulfonic acid ester may be in integral form with the cresol novolac resin wherein the sulfonic acid ester bonds, in part or in entirety, with the cresol novolac resin via an ester bond. In case the naphthoquinonediazidosulfonic acid ester bonds in entirety with the cresol novolac resin, the cresol novolac resin material is equated with the naphthoquinonediazido ester material. Specifically, a material combination of cresol novolac resin with naphthoquinonediazidosulfonic acid ester may be:

(A-1) (i) a cresol novolac resin having some or all phenolic hydroxyl groups esterified with 1,2-naphthoquinonediazidosulfonyl halide (e.g., chloride or bromide), or (ii) a mixture of a cresol novolac resin having some or all phenolic hydroxyl groups esterified with 1,2-naphthoquinonediazidosulfonyl halide and a cresol novolac resin having phenolic hydroxyl groups non-esterified, (A-2) the novolac resin (i) or the novolac resin mixture (ii) of (A-1) and a 1,2-naphthoquinonediazidosulfonic acid ester, or (A-3) a cresol novolac resin having phenolic hydroxyl groups non-esterified and a 1,2-naphthoquinonediazidosulfonic acid ester.

In this case, the content of component (A-1), (A-2) or (A-3) is 45 to 98%, preferably 70 to 98% by weight in the total solids weight of the sacrificial film-forming composition, and the total amount of the esterized cresol novolac resin and the non-esterized cresol novolac resin is at least 67% (67 to 100%) by weight in component (A-1), (A-2) or (A-3). In case of component (A-2) or (A-3), the total amount of the esterized cresol novolac resin and the non-esterized cresol novolac resin is 67 to 99% by weight, preferably 75 to 99% by weight in component (A-2) or (A-3).

Since the optically patternable sacrificial film-forming composition must fulfill both a high resolution and a propensity to experience only a little geometric change during the crosslinking step, the cresol novolac resin used therein should preferably have a weight average molecular weight (Mw) of 2,000 to 30,000, more preferably 3,000 to 20,000, as measured by gel permeation chromatography (GPC) versus polystyrene standards. If the cresol novolac resin has a Mw of less than 2,000, there may be a risk of the pattern being deformed due to volatilization of some low-molecular-weight components in optical/thermal treatment during the subsequent step of forming crosslinks within the resin in the sacrificial film pattern. If the cresol novolac resin has a Mw of more than 30,000, there may be a risk of losing high accuracy in pattern shaping by the lithography.

The cresol novolac resin is preferably one prepared from a cresol reactant containing at least 40 mol %, more preferably at least 45 mol % of p-cresol. The resin used herein may be a single resin or a mixture of two or more different resins. The content of p-cresol in the cresol reactant is one factor that affects the solubility of the sacrificial film in developer and dictates the resulting pattern shape. If the p-cresol content is less than 40 mol %, the positive film in the unexposed area may become less resistant to developer, failing to maintain the film thickness during the development step in the lithography pattern-forming process. Also, to adjust the solubility of the resin film in alkaline developer, some phenol groups in the resin may be esterified with ester groups such as methylcarboxyl.

On the other hand, the cresol novolac resin should preferably have a melting temperature of at least 130° C., more preferably at least 135° C., when the heating step for forming crosslinks within the resin in the sacrificial film pattern is taken into account. If the melting temperature is lower than the range, the heat treatment step may cause thermal deformation to the resin pattern. Then, the cresol novolac resin may contain, in part, a xylenol or trimethylphenol structure for the purpose of adjusting the resin's melting temperature.

The other component of the sacrificial film-forming composition is a naphthoquinonediazidosulfonic acid ester. It may take the form of a relatively low molecular weight compound in which a compound having a plurality of phenolic hydroxyl groups such as 1,2,3-trihydroxybenzophenone is ester-bonded with a naphthoquinoneazidosulfonic acid chloride such as 1,2-naphthoquinoneazido-5-sulfonic acid chloride, or it may be used in the form ester-bonded with the cresol novolac resin. Many esters are known from Patent Documents 5 and 6, for example, and any of them may be generally used herein. The sacrificial film pattern should have a sidewall angle of from 80° to less than 90° so that a finer, more accurate micro-structure may be formed therefrom. In order to process the desired shape from an optically patternable sacrificial film having a thickness of 2 to 20 μm, the film is preferably formed from the composition in which the cresol novolac resin is not only optimized as mentioned above, but also has been esterified with naphthoquinonediazidosulfonyl halide because the desired shape is readily available therefrom.

When a 1,2-naphthoquinonediazidosulfonic acid ester with a low molecular weight is used alone, it is preferable to use 1,2-naphthoquinonediazidosulfonic acid ester having a molecular weight of up to 1,500. The amount of the low molecular weight naphthoquinonediazidosulfonic acid ester is 1 to 33%, especially 1 to 25% by weight in component (A-2) or (A-3).

Examples of suitable naphthoquinonediazidosulfonic acid ester with a low molecular weight include 2,3,4-trihydroxybenzophenone naphthoquinonediazidosulfonate, 2,3,4,4'-tetrahydroxybenzophenone naphthoquinonediazidosulfonate, and 2,2',4,4'-tetrahydroxybenzophenone naphthoquinonediazidosulfonate, but are not limited thereto.

When a naphthoquinonediazidosulfonic acid is used in the form ester bonded with a cresol novolac resin, preference is given to those cresol novolac resins in which 1 to 30 mol %, more preferably 2 to 25 mol % of overall phenolic hydroxyl groups are esterified with 1,2-naphthoquinonediazidosulfonic acid, because a film pattern having a sidewall angle of from 80° to less than 90° is readily available therefrom. If the degree of esterification is less than 1 mol %, the cresol novolac resin itself may have less resistance to developer because the effect of ester bonding is substantially lost. If the degree of esterification is more than 30 mol %, a loss of resin transparency may make it difficult for the pattern sidewall to maintain an angle of at least 80°. As long as the above-indicated problem of light transmittance does not arise, a naphthoquinonediazidosulfonic acid ester with a low molecular weight may be used in combination with a cresol novolac resin having ester-bonded naphthoquinonediazidosulfonic acid.

The content of component (A-1), (A-2) or (A-3) is 45 to 98% by weight, preferably not less than 70% by weight to less than 98% by weight in the total solids weight of the sacrificial film-forming composition.

The sacrificial film-forming composition used in the method for manufacturing a micro-structure according to the invention is formulated by adding to a commonly used cresol novolac-naphthoquinonediazido resist composition a crosslinker capable of forming crosslinks between molecules of the cresol novolac resin in the presence of an acid catalyst. The crosslinker used herein may be any of crosslinkers capable of crosslinking an alkali-soluble resin in a chemically amplified negative resist composition for negative working, for example, melamines, alkoxymethylureas, and alkoxymethylglycolurils. Once the sacrificial film pattern is formed, the crosslinker is activated by the acid which is generated by the naphthoquinonediazidosulfonic acid ester or a separately added acid generator upon second light exposure, whereupon it undergoes electrophilic reaction with phenolic hydroxyl groups or aromatic ring of the cresol novolac resin to form crosslinks, whereby the resin is increased in molecular weight and improved in heat resistance.

While examples of the acid generator will be described later, it may be preferably added in an amount of 0 to 15% by weight, preferably 0.1 to 15% by weight, more preferably 0.2 to 10% by weight, especially 0.3 to 7% by weight in the total solids weight of the composition.

With regard to cresol novolac resins, it is known that the resins increase their degree of polymerization under the action of radicals which are liberated from the resin upon light exposure, and that thermal reaction of naphthoquinonediazido forms crosslinks between molecules of the resins. The crosslink formation by the crosslinker is effective for providing more resistance to the heat condition in stage (ii), and the crosslinker is essential for substantially restraining any shape change.

To the sacrificial film-forming composition, the crosslinker is preferably added in an amount of 2 to 30% by weight, more preferably 3 to 25% by weight, in the total solids weight of the composition. The preferred crosslinker is selected from melamine compounds. The melamine compound is preferably hexamethoxymethylol melamine in monomer and condensate forms. The monomer content is preferably at least 80% by weight, more preferably at least 85% by weight of the total melamine compound. As long as a content of hexamethoxymethylol melamine monomer is at least 80% by weight, the resin structure formed therefrom has sufficient heat resistance to allow a temperature above 200° C. to prevail in stage (ii). If the amount of the melamine compound added is less than 2% by weight, the desired addition effect is not available. If the amount of the melamine compound added is more than 30% by weight, the unexposed area of the resin film may be less resistant to developer during the development step of the lithography process.

Besides the main components described above, other well-known additives may be added to the sacrificial film-forming composition. For example, dyes and photoacid generators other than the above-said photoacid generator which are effective in a wavelength range of 350 to 450 nm may be added for the purpose of adjusting the sensitivity or sidewall angle of the film pattern. An appropriate addition amount is usually 0 to 10% by weight, preferably 0.1 to 5.0% by weight in the total solids weight of the composition. Suitable dyes include benzophenones such as 1,2,3-trihydroxybenzophenone, curcumine, and azo dyes such as 2-phenyl-azo-4-methylphenol. Even when the sacrificial film pattern is desired to have a sidewall angle of less than 80°, a sacrificial film pattern having the desired sidewall angle can be formed by adjusting the amount of the dye or naphthoquinonediazidosulfonic acid ester.

If necessary, a surfactant may be added to the pattern-forming material for the purpose of improving coating characteristics. Suitable surfactants include nonionic, fluorochemical, and silicone surfactants. The surfactant is usually added in an amount of 0 to 0.5%, preferably 0.01 to 0.5%, especially 0.01 to 3% by weight in the total solids weight of the composition.

Also a photoacid generator other than the naphthoquinonediazidosulfonic acid ester may be added as an auxiliary for promoting crosslinking reaction of the crosslinker, though not essential. It may be any of photoacid generators which are commonly used in chemically amplified resist compositions. Examples of the photoacid generator which can be advantageously used herein include oximesulfonates such as 4-methoxy-α-(p-toluenesulfonyloxyimino)phenylacetonitrile and α-(4-toluenesulfonyloxyimino)-3-thienylacetonitrile, 1,8-naphthalimide-10-camphorsulfonate, 1,8-naphthalimide-10-p-toluenesulfonate, and imid-yl-sulfonate derivatives such as 5-norbornene-2,3-dicarboxyimid-yl-n-butylsulfonate.

Besides the solid components described above, the sacrificial film-forming composition may further comprise a solvent capable of dissolving the solid components to form a coating solution. A content of the solvent is generally 50 to 90% by weight of the overall composition. Any of well-known solvents commonly used in resists may be used. Suitable solvents include ethylene glycol monoalkyl ethers and acetates thereof, propylene glycol monoalkyl ethers and acetates thereof, diethylene glycol mono- or di-alkyl ethers, alkyl lactates, alkoxypropionic acid alkyl esters, ketones such as methyl isobutyl ketone and cyclohexanone, and acetates such as butyl acetate. These solvents may be used alone or in admixture of two or more.

According to the invention, an optically patternable sacrificial film is formed using the sacrificial film-forming composition as formulated above. The film may be foamed by many well-known techniques. Typically, a solution containing the positive photoresist composition may be applied onto a selected substrate by a spin coating, printing or other suitable technique. After coating, heat treatment is carried out at a temperature of about 80 to 130° C. using a hot plate or oven, yielding an optically patternable sacrificial film having a thickness of 2 to 20 μm which is necessary to define a cavity or space in the micro-structure.

Step (B) is to expose patternwise the optically patternable sacrificial film to first high-energy radiation to invite a change of solubility so that the unnecessary portion of the sacrificial film resulting from step (A) may be dissolved away in the subsequent step or development. The first high-energy radiation used in this patternwise exposure is not particularly limited as long as the naphthoquinonediazidosulfonic acid ester is sensitive thereto. The preferred high-energy radiation is UV radiation in the range of 350 to 450 nm. The optimum exposure dose is determined depending on a particular sacrificial film used. After an optimum exposure dose necessary for pattern formation is previously determined as disclosed in Patent Documents 5 and 6, the film is exposed to a pattern of radiation in the optimum dose.

Step (C) is to develop the sacrificial film with an alkaline developer to form a positive sacrificial film pattern. Specifically, the portion of the sacrificial film which has been exposed to high-energy radiation in step (B) is dissolved away using an aqueous alkaline developer. The aqueous alkaline developer is typically an aqueous solution of tetramethylammonium hydroxide (TMAH) in a concentration of 1.0 to 3.5% by weight, preferably 1.3 to 3.0% by weight. Through this development, the portion of the resin film which has been exposed to UV radiation is dissolved away, leaving the desired sacrificial film pattern.

Step (D) is intended to provide the sacrificial film pattern with heat resistance so that high temperature conditions may be applied in stage (ii). To this end, step (D) includes exposing the sacrificial film pattern to second high-energy radiation, and then heating the sacrificial film pattern, for thereby forming crosslinks between molecules of the cresol novolac resin in the sacrificial film pattern.

Exposure to second high-energy radiation is utilized to generate an acid for catalyzing the reaction of the crosslinker. Upon exposure to second high-energy radiation, the naphthoquinonediazidosulfonic acid ester and the acid generator, if added, present in the portion of the sacrificial film pattern which has not been exposed to the first high-energy radiation generate corresponding acids. The acid generated acts to create cations at plural activation sites of the crosslinker, typically melamine, triggering electrophilic substitution reaction on hydroxyl group or aromatic ring of the cresol novolac resin to form crosslinks in the cresol novolac resin.

The irradiation of second high-energy radiation may be flood exposure over the entire substrate. Therefore, the second high-energy radiation may be monochromatic light, or a non-monochromatic light source may be used. Suitable light sources for the second high-energy radiation include UV emissions in a wavelength range of 350 to 450 nm, monochromatic light in the wavelength range, and electron beam. The exposure dose of second high-energy radiation is to provide an energy amount which is preferably 0.5 to 20 times, more preferably 1 to 15 times the energy amount used in the exposure to first high-energy radiation.

After the irradiation of second high-energy radiation, heat treatment is carried out at a temperature of 100 to 220° C. in order to promote crosslinking reaction. In the heating step following the high-energy radiation irradiation, a hot plate or a heating device like an oven is typically used, although the heating means is not particularly limited. The heat treatment may be at a single stage or multiple stages. For example, in the case of heating at or above 160° C., a stage of heating at a temperature below 160° C. may be followed by a stage of heating at a temperature of at least 160° C. because such staged heating is more effective for preventing deformation of the pattern profile.

Since the crosslink formation using the crosslinker ensures efficient introduction of crosslinks, high heat resistance is more readily established. Even when the sacrificial film pattern resulting from step (C) wherein the structure has a sidewall angle from 80° to less than 90° is exposed to heat of 200° C., for example, it experiences a minimized profile change.

Once the sacrificial film pattern is formed as described above, it is overlaid with an inorganic material film. Examples of the inorganic material film include amorphous silicon film and silicon oxide film. The method for forming the inorganic material film may be physical vapor deposition (PVD), typically sputtering or chemical vapor deposition (CVD). In particular, the CVD of amorphous silicon is preferred because a uniform inorganic material film can be easily formed. Since the CVD technique has a propensity that the temperature of the substrate surface rises above 200° C., the invention is advantageous under such circumstances. The inorganic material film preferably has a thickness of 0.1 to 2 μm, more preferably 0.3 to 1 μm, although the film thickness varies depending on the intended device.

Typically, the inorganic material film deposited on the sacrificial film pattern which maintains its profile at a high accuracy is then additionally processed or shaped, depending on a particular purpose. As described in Patent Documents 1 to 4, at this point, the inorganic material film is partially provided with apertures for etching away the sacrificial film pattern. The method for forming apertures may be selected as appropriate depending on the function and shape of the intended device. The apertures may be formed by any well-known techniques, for example, a lithography process using a photoresist composition, and peeling of top surface by chemical mechanical polishing (CMP).

Then the sacrificial film pattern is etched away through the apertures, completing a space having the contour of the sacrificial film pattern.

Since the sacrificial film is made of a cresol novolac resin based material, it may be readily removed by any of wet and dry etching techniques as used in the removal of a conventional cresol novolac resin based negative resist composition. Advantageously, the sacrificial film may be removed by oxygen plasma ashing, a simple technique having no impact on the inorganic material film.

EXAMPLE

Synthesis Examples, Examples and Comparative Examples are given below for further illustrating the invention although the invention is not limited thereto. Note that Mw is a weight average molecular weight as measured by gel permeation chromatography (GPC) versus polystyrene standards.

Photosensitive Resin Synthesis Example 1

A flask equipped with a stirrer, nitrogen purge tube and thermometer was charged with 120 g of a cresol novolac resin containing 50 mol % of p-cresol and 50 mol % of m-cresol and having a melting temperature of 145° C. and Mw of 4,500, 21.5 g of 1,2-naphthoquinone-2-diazido-5-sulfonyl chloride (corresponding to 8 mol % based on phenolic hydroxyl groups in the resin), and 500 g of 1,4-dioxane, which were stirred until uniform. To the solution at room temperature, 8.5 g of triethylamine was added dropwise. At the end of dropwise addition, stirring was continued for 10 hours. The reaction solution was poured into a large volume of 0.1N hydrochloric acid solution whereupon the precipitating resin was recovered. The resin was dried in a vacuum dryer, obtaining 115 g of a novolac resin (1) which was partially esterified with 1,2-naphthoquinone-2-diazido-5-sulfonyl, having a degree of esterification of 8 mol % on average and a Mw of 4,750.

When a molecular weight of a phenolic hydroxyl group of a novolac resin is defined as OH equivalent, a degree of esterification is a ratio of a number of moles of 1,2-naphthoquinonediazidosulfonyl group introduced in the phenolic hydroxyl group to a number of moles of 1,2-naphthoquinonediazidosulfonyl group charged.

Photosensitive Resin Synthesis Example 2

The procedure of Photosensitive Resin Synthesis Example 1 was repeated aside from using 120 g of a cresol novolac resin containing 55 mol % of p-cresol and 45 mol % of m-cresol and having a melting temperature of 149° C. and Mw of 16,000, and 16.1 g of 1,2-naphthoquinone-2-diazido-5-sulfonyl chloride (corresponding to 6 mol % based on phenolic hydroxyl groups in the resin). There was obtained a partially esterified novolac resin having a degree of esterification of 6 mol % on average and a Mw of 16,200.

Photosensitive Resin Synthesis Example 3

The procedure of Photosensitive Resin Synthesis Example 1 was repeated aside from using 120 g of a cresol novolac resin containing 45 mol % of p-cresol and 55 mol % of m-cresol and having a melting temperature of 143° C. and Mw of 6,000, and 32.2 g of 1,2-naphthoquinone-2-diazido-5-sulfonyl chloride (corresponding to 12 mol % based on phenolic hydroxyl groups in the resin). There was obtained a partially esterified novolac resin having a degree of esterification of 12 mol % on average and a Mw of 6,300.

Example 1

Preparation of Optically Patternable Sacrificial Film-Forming Composition

A pattern-forming composition #1 was prepared by dissolving 35 g of the cresol novolac resin obtained in Photosensitive Resin Synthesis Example 1, 3 g of hexamethoxymethylol melamine having a monomer concentration of 97%, 0.7 g of a naphthoquinonediazidosulfonic acid ester in which three hydroxyl groups of 1,2,3-trihydroxybenzophenone form ester bonds with 1,2-naphthoquinoneazido-5-sulfonic acid (NT-300P by Toyo Gosei Co., Ltd.), and 0.01 g of a fluorinated silicone surfactant X-70-093 (trade name by Shin-Etsu Chemical Co., Ltd.) in 60 g of ethyl lactate, and filtering the resulting solution through a filter having a pore size of 0.2 μm.

Film and Pattern Formation of Optically Patternable Sacrificial Film

The optically patternable sacrificial film-forming composition #1 obtained above was spin coated onto a silicon wafer and prebaked on a hot plate at 100° C. for 120 seconds to form a film of 3 μm thick. The film-bearing wafer was exposed by means of an i-line stepper NSR-1755i7A (Nikon Corp.), developed with a 2.38 wt % tetramethylammonium hydroxide aqueous solution for 90 seconds, rinsed with deionized water for 30 seconds, and spin dried. The exposure dose was 400 mJ/cm$^2$, and a stripe pattern of 1.0 μm could be formed. By the same procedure as above, a stripe pattern of 10 μm was formed. At this point, the film had a thickness of 2.7 μm. Both the stripe patterns of 1.0 μm and 10 μm had a side wall angle of 87°. The sidewall angle was measured by using a field emission type electron microscope S-4700 (manufactured by Hitachi High Technology Co., Ltd.).

These wafers were exposed again in two doses of 400 mJ/cm$^2$ and 2,000 mJ/cm$^2$ by means of the i-line stepper, and heat treated in an oven at 150° C. for 30 minutes and further at 200° C. for 30 minutes (total heat treatment time 1 hour). There were obtained wafers ready for surface micromachining. At this point, for the wafer subjected to i-line exposure in a dose of 400 mJ/cm$^2$, the 1.0-μm stripe pattern had a sidewall angle of 85°, and the 10-μm stripe pattern had a sidewall angle of 83°. For the wafer subjected to i-line exposure in a dose of 2,000 mJ/cm$^2$, the 1.0-μm stripe pattern had a sidewall angle of 87°, and the 10-μm stripe pattern had a sidewall angle of 86°.

In a test, these wafers were subjected to heat treatment at 250° C. for 30 minutes, which was a simulation of formation of an inorganic film by plasma-enhanced CVD. After the heat treatment, the film thickness was measured by an optical film thickness measurement apparatus, finding that the thickness of 2.7 μm was maintained and the pattern sidewall angle remained unchanged.

On the pattern-bearing wafers following the heat treatment, amorphous silicon was deposited. Using a plasma-enhanced CVD system (PD-220 by Samuco Co.), an amorphous silicon film of 0.4 μm thick was deposited on the stripe pattern-bearing substrate by heat treatment at 250° C. for 30 minutes. The film could be successfully deposited without defects in the pattern sidewall.

Further, an i-line exposure positive resist based on a common cresol novolac resin (SIPR-9740 by Shin-Etsu Chemical Co., Ltd.) was coated onto the amorphous silicon film on the sacrificial film pattern to form a photoresist film of 2 μm thick, which was patterned. Using the photoresist pattern as mask, fluorine plasma etching with $SF_6$ was carried out, whereby apertures penetrating to the sacrificial film pattern were defined in the amorphous silicon film. Thereafter, the pattern of resist SIPR-9740 was dissolved away in acetone. This was followed by ashing with oxygen plasma by the RF plasma process for 10 minutes, finding that the resin coating which had been heat treated at 250° C. could be readily removed.

The data demonstrate that the sacrificial film pattern formed by the inventive method has adequate properties for surface micromachining of an inorganic film or the like by the sacrificial layer etching technique.

Examples 2 and 3

As in Example 1, pattern-forming compositions as shown in Table 1 was prepared. Similarly, an optically patternable sacrificial film was formed from each of the compositions, and subjected to patternwise exposure in a dose of 2,000 $mJ/cm^2$ and 700 $mJ/cm^2$ by means of a g-line stepper NSR-1505g2A (Nikon Corp.). The second exposure step following development used the g-line stepper again and provided a dose of 2,000 $mJ/cm^2$.

The exposure was followed by heat treatment in an oven at 180° C. for 3 hours, forming the desired heat resistant resin structure on the substrate. To examine heat resistance, the structure was heat treated at 250° C. for 30 minutes, after which the angle of the pattern sidewall was measured. The results are shown in Table 2.

TABLE 1

Optically patternable sacrificial film-forming composition

| | Resin | Melamine compound | Additive | Solvent |
|---|---|---|---|---|
| Example 2 | Photosensitive Resin Synthesis Example 2 (100 pbw) | HMMM (20 pbw) | X-70 (0.1 pbw) | PGMEA (130 pbw) |
| Example 3 | Photosensitive Resin Synthesis Example 3 (100 pbw) | HMMM (20 pbw) | X-70 (0.1 pbw) NT (3 pbw) | PGMEA (180 pbw) |

HMMM: hexamethoxymethylol melamine (purity 97%)
X-70: fluorinated silicone surfactant X-70-093 by Shin-Etsu Chemical Co., Ltd.
NT: naphthoquinonediazidosulfonic acid ester NT-300P by Toyo Gosei Co., Ltd.
PGMEA: propylene glycol monomethyl ether acetate by Kyowa Hakko Chemical Co., Ltd.

TABLE 2

Processing conditions and results of heat treatment

| | Sacrificial film thickness | Sidewall angle after development | | Sidewall angle after 250° C./30 min heat treatment | |
|---|---|---|---|---|---|
| | | 1.0 μm stripe pattern | 10 μm stripe pattern | 1.0 μm stripe pattern | 10 μm stripe pattern |
| Example 2 | 15 μm | 84° | 85° | 82° | 82° |
| Example 3 | 6 μm | 83° | 86° | 82° | 83° |

The data demonstrate that like Example 1, Examples 2 and 3 have a desired sidewall angle after development and maintain the sidewall angle substantially unchanged even on heat treatment, and that the sacrificial film pattern has adequate properties for surface micromachining of an inorganic film or the like by the sacrificial layer etching technique.

Comparative Example 1

As in Example 1, stripe patterns of 1.0 μm and 10 μm were foamed on silicon substrates, using the pattern-forming composition #1 and the i-line stepper.

The patterns were directly heat treated at 250° C. for 30 minutes, after which the angle of the pattern sidewall was measured. Both the stripe patterns of 1.0 μm and 10 μm had a sidewall angle of less than 40° and a film thickness which was reduced to 2.3 μm. This was unacceptable for surface micromachining.

Comparative Example 2

As in Example 1, stripe patterns of 1.0 μm and 10 μm were formed on silicon substrates, using the pattern-forming composition #1 and the i-line stepper.

The patterns were exposed in a dose of 4,000 $mJ/cm^2$ by means of the i-line stepper and then heat treated at 250° C. for 30 minutes, after which the angle of the pattern sidewall was measured. Both the stripe patterns of 1.0 μm and 10 μm had a sidewall angle of less than 60° and a film thickness which was reduced to 2.4 μm. This was unacceptable for surface micromachining.

Comparative Example 3

As in Example 1, stripe patterns of 1.0 μm and 10 μm were formed on silicon substrates, using the pattern-forming composition #1 and the i-line stepper.

The patterns were directly (without UV exposure) heat treated in an oven at 150° C. for 30 minutes and further at 200° C. for 30 minutes (total heat treatment time 1 hour). In the course of heat treatment, the pattern sidewall angle decreased below 60°. This was unacceptable for surface micromachining.

Comparative Example 4

A negative resist composition was prepared by dissolving 100 parts by weight of a cresol novolac resin containing 50 mol % of p-cresol and 50 mol % of m-cresol and having a melting temperature of 145° C. and Mw of 4,500, 25 parts of hexamethoxymethylol melamine having a monomer concentration of 97%, 2 parts of 1,8-naphthalimide-10-camphor sulfonate as photoacid generator, and 0.1 part of a surfactant X-70-093 (by Shin-Etsu Chemical Co., Ltd.) in 180 parts of PGMEA, and filtering the resulting solution through a filter having a pore size of 0.2 μm. The negative resist composition was spin coated onto a substrate and prebaked on a hot plate at 100° C. for 2 minutes to form a resin thin film of 3 μm thick.

The negative resist film was exposed by means of an i-line stepper through a mask having a 1.0 μm or 10 μm stripe pattern in a dose of 500 mJ/cm². After exposure, the film was heat treated at 120° C. for 2 minutes and developed with a 2.38 wt % tetramethylammonium hydroxide aqueous solution for 2 minutes, obtaining the desired stripe pattern. The sidewall of the pattern was observed. After development, the 1.0-μm stripe pattern had an angle of 103° and the 10-μm stripe pattern had an angle of 101°.

The film was further exposed to UV in a dose of 2,000 mJ/cm² by means of the i-line stepper and heat treated in an oven at 150° C. for 30 minutes and further at 200° C. for 30 minutes (total heat treatment time 1 hour). At this point, the 1.0-μm stripe pattern had a sidewall angle of 105° and the 10-μm stripe pattern had a sidewall angle of 110°, indicating an inversely tapered profile.

As in Example 1, an amorphous silicon film was deposited on the wafer having a negative profile pattern of the negative resist composition thereon. On observation of the wafer after deposition, no silicon film was deposited in the shadow of the inversely tapered sidewall because the pattern has a negative profile. This was practically unacceptable.

The invention is not limited to the foregoing Examples because they are merely given by way of illustration. The invention includes all embodiments having substantially the same construction and the same effect as the technical concept set forth in the appended claims.

According to the invention, a resin structure suited for sacrificial layer etching, which is an important technique for surface micromachining, can be formed on a substrate by a simple method and be advantageously utilized in the process for manufacturing MEMS elements or the like.

Although some preferred embodiments have been described, many modifications and variations may be made thereto in light of the above teachings. It is therefore to be understood that the invention may be practiced otherwise than as specifically described without departing from the scope of the appended claims.

Japanese Patent Application No. 2010-133606 is incorporated herein by reference.

What is claimed is:

1. An optically patternable sacrificial film-forming composition for use in surface micro-machining process, comprising
    (A-1) (i) a cresol novolac resin consisting of at least 40 mol % of p-cresol and the remainder of m-cresol and having a weight average molecular weight of 2,000 to 30,000 and a melting temperature of at least 130° C. in which some or all phenolic hydroxyl groups are esterified with 1,2-naphthoquinonediazidosulfonyl halide, or (ii) a mixture of the cresol novolac resin consisting of at least 40 mol % of p-cresol and the remainder of m-cresol and having a weight average molecular weight of 2,000 to 30,000 and having some or all phenolic hydroxyl groups esterified with 1,2-naphthoquinonediazidosulfonyl halide and a cresol novolac resin consisting of at least 40 mol % of p-cresol and the remainder of m-cresol and having a weight average molecular weight of 2,000 to 30,000 and a melting temperature of at least 130° C. in which phenolic hydroxyl groups are not esterified, or (A-2) the novolac resin (i) or the novolac resin mixture (ii) of (A-1) and a 1,2-naphthoquinonediazidosulfonic acid ester, and
    a crosslinker capable of foiiiiing crosslinks within the cresol novolac resin in the presence of an acid catalyst.

2. The composition of claim 1 wherein the content of component (A-1) or (A-2) is 45 to 98% by weight in the total solids weight of the sacrificial film-forming composition, and the total amount of the esterized cresol novolac resin and the non-esterized cresol novolac resin is at least 67% by weight in component (A-1) or (A-2).

3. The composition of claim 1 wherein said crosslinker is a melamine compound and said sacrificial film-forming composition comprises 2 to 30% by weight of the melamine compound in the total solids weight of the composition.

4. The composition of claim 1 wherein a cresol novolac resin in which 1 to 30 mol % of phenolic hydroxyl groups are esterified with 1,2-naphthoquinonediazidosulfonyl halide is present.

5. The composition of claim 1 which further comprises at least one photoacid generator selected from the group consisting of oximesulfonates and imid-yl-sulfonate derivatives.

6. The composition of claim 5 wherein the photoacid generator is selected from the group consisting of 4-methoxy-α-(p-toluenesulfonyloxyimino)phenylacetonitrile, α-(4-toluenesulfonyloxyimino)-3-thienylacetonitrile, 1,8-naphthalimide-10-camphorsulfonate, 1,8-naphthalimide-10-p-toluenesulfonate, and 5-norbornene-2,3-dicarboxyimid-yl-n-butylsulfonate.

7. A material for manufacturing a micro-structure comprising a substrate and a sacrificial film formed thereon, said sacrificial film comprising the optically patternable sacrificial film-forcing composition of claim 1.

8. A material for manufacturing a micro-structure comprising a substrate and a sacrificial film pattern formed thereon, said sacrificial film pattern being formed from the sacrificial film comprising the optically patternable sacrificial film-forming composition of claim 1.

9. The material of claim 7, wherein the sacrificial film has a thickness of 2.0 to 20 μm.

10. The material of claim 8, wherein the sacrificial film has a sidewall angle from 80° to less than 90°.

11. The composition of claim 1, wherein component (A-1) is (i) a cresol novolac resin consisting of at least 40 mol % of p-cresol and the remainder of m-cresol and having a weight average molecular weight of 2,000 to 30,000 and a melting temperature of at least 130° C. in which some or all phenolic hydroxyl groups are esterified with 1,2-naphthoquinonediazidosulfonyl halide.

12. The composition of claim 1, comprising:
    (A-1) (i) a cresol novolac resin consisting of at least 40 mol % of p-cresol and the remainder of m-cresol and having a weight average molecular weight of 2,000 to 30,000and a melting temperature of at least 130° C. in which some or all phenolic hydroxyl groups are esterified with 1,2-naphthoquinonediazidosulfonyl halide, or (ii) a mixture of the cresol novolac resin consisting of at least 40 mol % of p-cresol and the remainder of m-cresol and having a weight average molecular weight of 2,000 to 30,000 and having some or all phenolic hydroxyl groups esterified with 1,2-naphthoquinonediazidosulfonyl halide and a cresol novolac resin consisting of at least 40 mol % of p-cresol and the remainder of m-cresol and having a weight average molecular weight of 2,000 to 30,000 and a melting temperature of at least 130° C. in which phenolic hydroxyl groups are not esterified, and
a crosslinker capable of forming crosslinks within the cresol novolac resin in the presence of an acid catalyst.

* * * * *